(12) United States Patent
Kenjo et al.

(10) Patent No.: US 6,384,405 B1
(45) Date of Patent: May 7, 2002

(54) INCREMENTAL ROTARY ENCODER

(75) Inventors: Katsuhiko Kenjo, Tokyo; Masami Shirai, Saitama, both of (JP)

(73) Assignees: Asahi Kogaku Kogyo Kabushiki Kaisha; Asahi Seimitsu Kabushiki Kaisha, both of Tokyo (JP)

( * ) Notice: Subject to any disclaimer, the term of this patent is extended or adjusted under 35 U.S.C. 154(b) by 0 days.

(21) Appl. No.: 09/559,083

(22) Filed: Apr. 27, 2000

(30) Foreign Application Priority Data

Apr. 28, 1999 (JP) ............................................ 11-123077

(51) Int. Cl.$^7$ .............................. G01D 5/34; G01B 7/30
(52) U.S. Cl. ............................ 250/231.14; 250/231.16; 250/203.1; 341/11; 324/207.21
(58) Field of Search ....................... 250/231.13, 231.14, 250/231.16, 231.18, 203.1, 206.1, 206.2, 214 R; 341/11, 13, 15; 324/207.13, 207.21; 356/614, 617, 139.01, 139.04; 33/707, 708

(56) References Cited

U.S. PATENT DOCUMENTS

| | | |
|---|---|---|
| 5,216,480 A | 6/1993 | Kaneko et al. |
| 6,184,518 B1 * | 2/2001 | Klein .................... 250/231.13 |
| 6,194,694 B1 * | 2/2001 | Shirai ..................... 250/201.2 |
| 6,304,079 B1 * | 10/2001 | Kenjo et al. ........... 324/207.21 |

* cited by examiner

*Primary Examiner*—Kevin Pyo
(74) *Attorney, Agent, or Firm*—Greenblum & Bernstein, P.L.C.

(57) ABSTRACT

An incremental rotary encoder having first and second sensors which each output two sine wave signals having a phase difference of 90 degrees while a rotary member of the incremental rotary encoder rotates. The incremental rotary encoder includes an absolute-zero-index detecting device, provided for the first sensor; at least one binary coding circuit which codes each of the two sine wave signals and the zero index signal into a corresponding binary signal; a holding device for holding the level data of the binary signal of each sine wave signal output from the second sensor when the absolute-zero-index detecting device outputs the zero index signal; and a controller for determining whether the phase of the two sine wave signals output from the second sensor advances or delays with respect to the phase of the two sine wave signals output from the first sensor.

20 Claims, 8 Drawing Sheets

Fig. 4
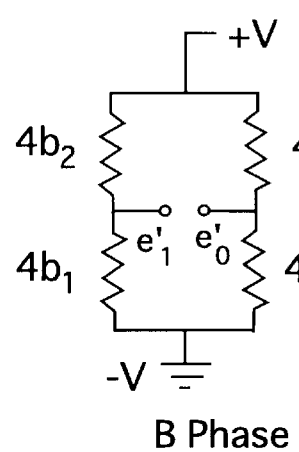
B Phase
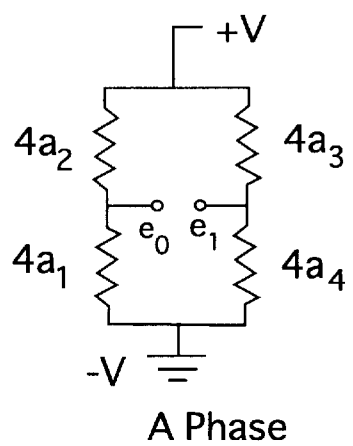
A Phase
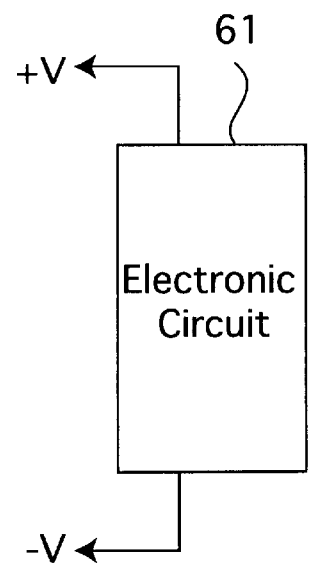

Electrical Angle $\lambda/2$

INCREMENTAL ROTARY ENCODER

BACKGROUND OF THE INVENTION

1. Field of the Invention

The present invention relates to an incremental rotary encoder which is suitable for surveying instruments such as total stations, theodlites or the like.

2. Description of the Related Art

Photoelectric incremental rotary encoders which output more than 10,000 pulses per revolution are widely used as incremental rotary encoders for surveying instruments. Photoelectric incremental rotary encoders are generally provided with two sensors which are positioned so as to be offset from each other by 180 degrees about a rotary scale disc (i.e., which are positioned so as to be opposite from each other with respect to the rotary scale disc). Each of the two sensors is generally provided together with an absolute-zero-index detecting device which outputs a signal (herein after called "zero index signal") each time each of the two sensors detects an absolute zero index formed on the rotary scale. The reason why the sensors are arranged so as to be offset from each other by 180 degrees about the rotary scale disc is to compensate for error due to eccentricity of the rotary scale disc. Moreover, the reason why the absolute-zero-index detecting device is necessary for each of the sensors is to avoid influence of the gap between the rotational shaft of the rotary scale disc and the bearing thereof (one cause of eccentricity of the rotary scale disc).

In vertical angle measurement using a photoelectric incremental rotary encoder, it is necessary to compensate for the aforementioned error due to eccentricity of the rotary scale disc to improve the accuracy of the encoder. In order to compensate for such error, it is effective that the two sensors be arranged to be offset from each other by 180 degrees about the rotary scale disc. However, the zero index signal needs to be output from only one of the two sensors in theory, so that it is costly and space-consuming for the absolute-zero-index detecting device be provided for each of the two sensors.

In the vertical angle measurement, in most cases, the point of detection of the absolute zero index is determined in accordance with the phase difference of the zero index signal with respect to two sine wave signals (a SIN signal and a COS signal) which are all output from a common sensor, and subsequently the points of variation in the signal level of each of the two sine wave signals are counted; usually four variation points are counted per pulse.

If the absolute-zero-index detecting device is provided with only one of the two sensors, the point of commencement of counting pulses which is determined after the detecting device detects the absolute zero index is substantially the same at all times at the sensor having the absolute-zero-index detecting device on one side of the rotary scale disk, whereas the absolute zero index might vary within a range of ± a few counts at the sensor on the other side of the rotary scale disk which does not have an absolute-zero-index detecting device. This causes the value of the pulse counter to include an error (absolute-zero-index detection error) each time the absolute zero index is detected.

In the incremental rotary encoders which output less pulses than the photoelectric incremental rotary encoders per revolution (about a few thousand pulses per revolution) such as magnetic incremental rotary encoders, the gap between the rotational shaft of the rotary scale disc and the bearing thereof is small relative to the pitch of the divisions of the rotary drum (e.g., magnetic drum), so that absolute-zero-index detection error hardly occurs. However, there still remains a possibility of a pulse counting error within a range of ± one count occurring.

SUMMARY OF THE INVENTION

An object of the present invention is to provide an incremental rotary encoder which outputs a relatively small number of pulses per revolution such as a magnetic incremental rotary encoder in which the absolute-zero-index detection error does not occur even if the absolute-zero-index detecting device is provided for only one of the two sensors, which are offset from each other by 180 degrees about the rotary disc or drum.

In order to achieve the above object, an incremental rotary encoder is provided having a first sensor and a second sensor, each of the first and second sensors outputting two sine wave signals having a phase difference of 90 degrees while a rotary member of the incremental rotary encoder rotates, the first and second sensors being positioned so as to be offset from each other by 180 degrees about the rotary member. The incremental rotary encoder includes an absolute-zero-index detecting device, provided for the first sensor, which outputs a zero index signal each time the first sensor detects an absolute zero index formed on the rotary member; at least one binary coding circuit which codes each of the two sine wave signals and the zero index signal into a corresponding binary signal; a holding device for holding the level data of the binary signal of each of the two sine wave signals output from the second sensor, at the moment the absolute-zero-index detecting device outputs the zero index signal; and a controller for determining whether the phase of the two sine wave signals output from the second sensor advances or delays with respect to the phase of the two sine wave signals output from the first sensor.

According to another aspect of the present invention, a surveying instrument is provided including a leveling board, a pedestal coupled to the leveling board to be rotatable about a vertical axis relative to the leveling board; a collimating telescope coupled to the pedestal to be rotatable about a horizontal axis relative to the pedestal; a horizontal-angle measuring device for measuring an angle of rotation of the pedestal relative to the leveling board; and a vertical-angle measuring device for measuring an angle of rotation of the collimating telescope relative to the pedestal. At least one of the horizontal-angle measuring device and the vertical-angle measuring device includes an incremental rotary encoder having a first sensor and a second sensor, each of the first and second sensors outputting two sine wave signals having a phase difference of 90 degrees while a rotary member of the incremental rotary encoder rotates, the first and second sensors being positioned so as to be offset from each other by 180 degrees about the rotary member, the incremental rotary encoder including an absolute-zero-index detecting device, provided for the first sensor, which outputs a zero index signal each time the first sensor detects an absolute zero index formed on the rotary member; at least one binary coding circuit which codes each of the two sine wave signals and the zero index signal into a corresponding binary signal; a holding device for holding the level data of the binary signal of each of the two sine wave signals output from the second sensor, at the moment the absolute-zero-index detecting device outputs the zero index signal; and a controller for determining whether the phase of the two sine wave signals output from the second sensor advances or delays with respect to the phase of the two sine wave signals output from the first sensor.

In the above aspects in the present invention, preferably, the incremental rotary encoder further includes a counter which increases or decreases a counter value thereof each time a point of variation occurs in each of the two sine wave signals output from each of the first and second sensors. The controller calculates an angle of rotation of the rotary member in accordance with the counter value of the counter which starts counting from a point of detection of the absolute zero index by the absolute-zero-index detecting device. The controller compensates for the counter value generated from the second sensor in accordance with a determination of advancing or delaying by the controller to determine the angle of rotation.

Preferably, the controller device determines whether the phase of the two sine wave signals output from the second sensor advances or delays with respect to the phase of the two sine wave signals output from the first sensor at 1/4 pitch.

Preferably, the rotary member includes a magnetic drum which is provided on an outer peripheral surface thereof with a multi-pole magnetized layer having a plurality of magnetized divisions equally divided, a pitch $\lambda$ of the plurality of magnetized divisions being predetermined, the magnetic drum being rotatably supported by a stationary portion. Each of the first sensor and the second sensor includes a magnetic sensor fixed relative to the stationary member to face the multi-pole magnetized layer. Each of the first sensor and the second sensor includes a plurality of magnetoresistor elements which are located at $\lambda/4$ intervals. The plurality of magnetoresistor elements are divided into two groups, magnetoresistor elements of each group of the two groups of magnetoresistor elements being arranged at $\lambda/2$ intervals.

Preferably, the incremental rotary encoder further includes at least one differential amplifier which amplifies the difference between outputs of each two groups of magnetoresistor elements to output a sine wave signal.

Preferably, the magnetic drum includes a magnetized portion which defines the absolute zero index, the magnetized portion being positioned on an outer peripheral surface of the magnetic drum at a position separate from the multi-pole magnetized layer in a direction of a rotational axis of the magnetic drum. The magnetic sensor of the first sensor includes at least one magnetoresistor element which is positioned so as to be able to face the magnetized portion to output the zero index signal each time the magnetized portion passes by the at least one magnetoresistor element.

Preferably, the absolute-zero-index detecting device includes an absolute-zero-index detecting circuit which outputs an absolute-zero-index detection pulse at the moment the level of one of the two sine wave signals output from the first sensor varies while the zero index signal is being generated. Two binary signals of two level data are output from the second sensor while the absolute-zero-index detection pulse is output.

Preferably, the incremental rotary encoder further includes a memory in which a compensation value, which corresponds with a determination of advancing or delaying by said controller, is stored. The controller detects a combination of the two level data of the two binary signals at the moment the absolute-zero-index detecting circuit outputs the absolute-zero-index detection pulse, subsequently determines whether the phase of the two sine wave signals output from the second sensor advances or delays with respect to the phase of the two sine wave signals output from the first sensor at 1/4 pitch, and thereafter stores a compensation value on advancing or delaying determined by the controller in the memory. The compensation value, which is stored in the memory, is added to the counter value to compensate for the counter value.

Preferably, the median voltage of the sine wave signal is approximately zero.

Preferably, the incremental rotary encoder is a magnetic incremental rotary encoder.

The present disclosure relates to subject matter contained in Japanese Patent Application No.11-123077 (filed on Apr. 28, 1999) which is expressly incorporated herein by reference in its entirety.

BRIEF DESCRIPTION OF THE DRAWINGS

The present invention will be discussed below in detail with reference to the accompanying drawings, in which:

FIG. 4 is a schematic circuit diagram of an embodiment showing the electrical connection of magnetoresistor elements mounted on a magnetic sensor of one of the magnetic incremental rotary encoders shown in FIGS. 1 and 2;

DESCRIPTION OF THE PREFERRED EMBODIMENTS

Figure 1:
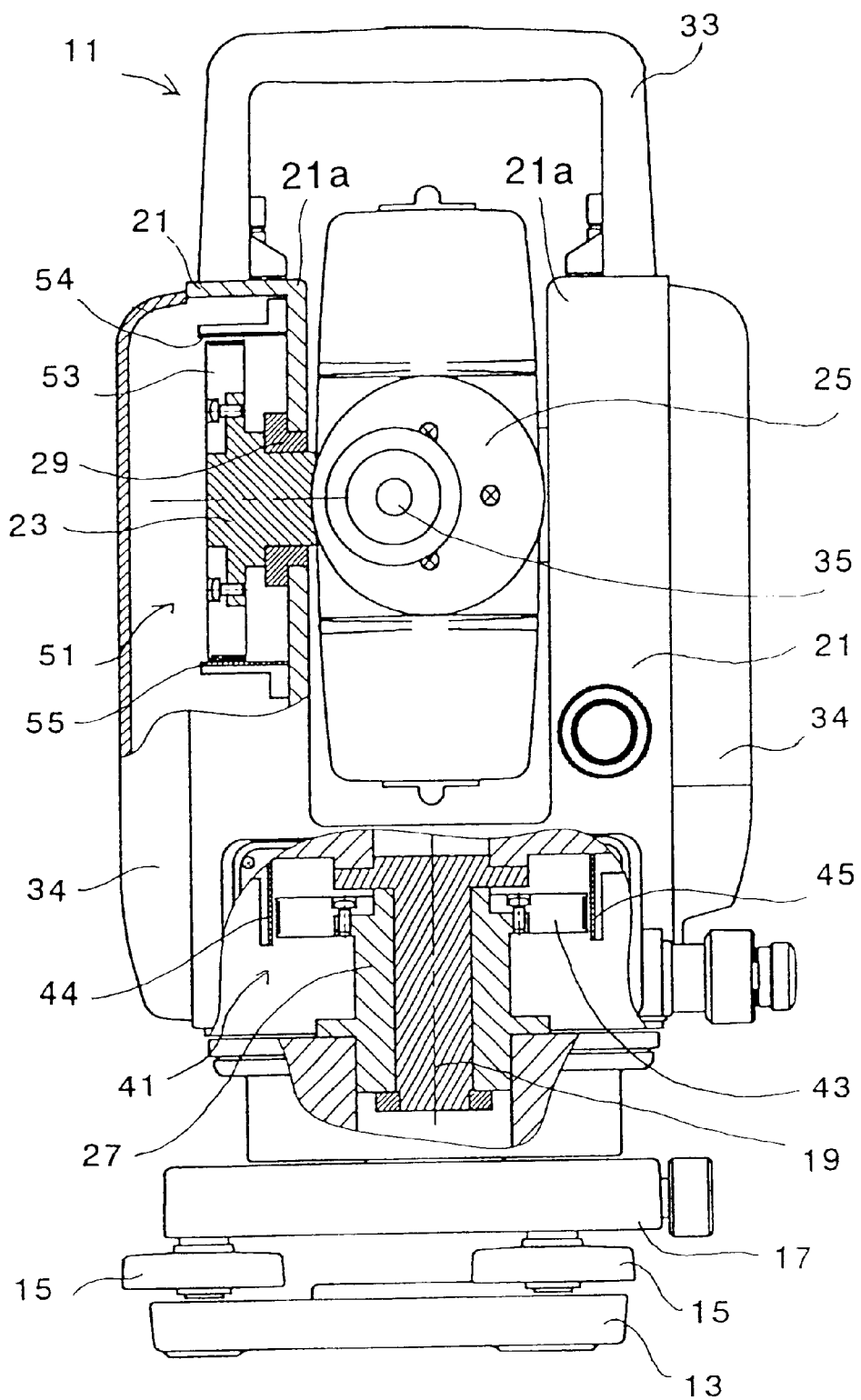
FIG. 1 is a rear elevational view of an embodiment of a total station which incorporates two magnetic incremental rotary encoders to which the present invention is applied, showing fundamental elements of each magnetic incremental rotary encoder in cross section.
Figure 2:
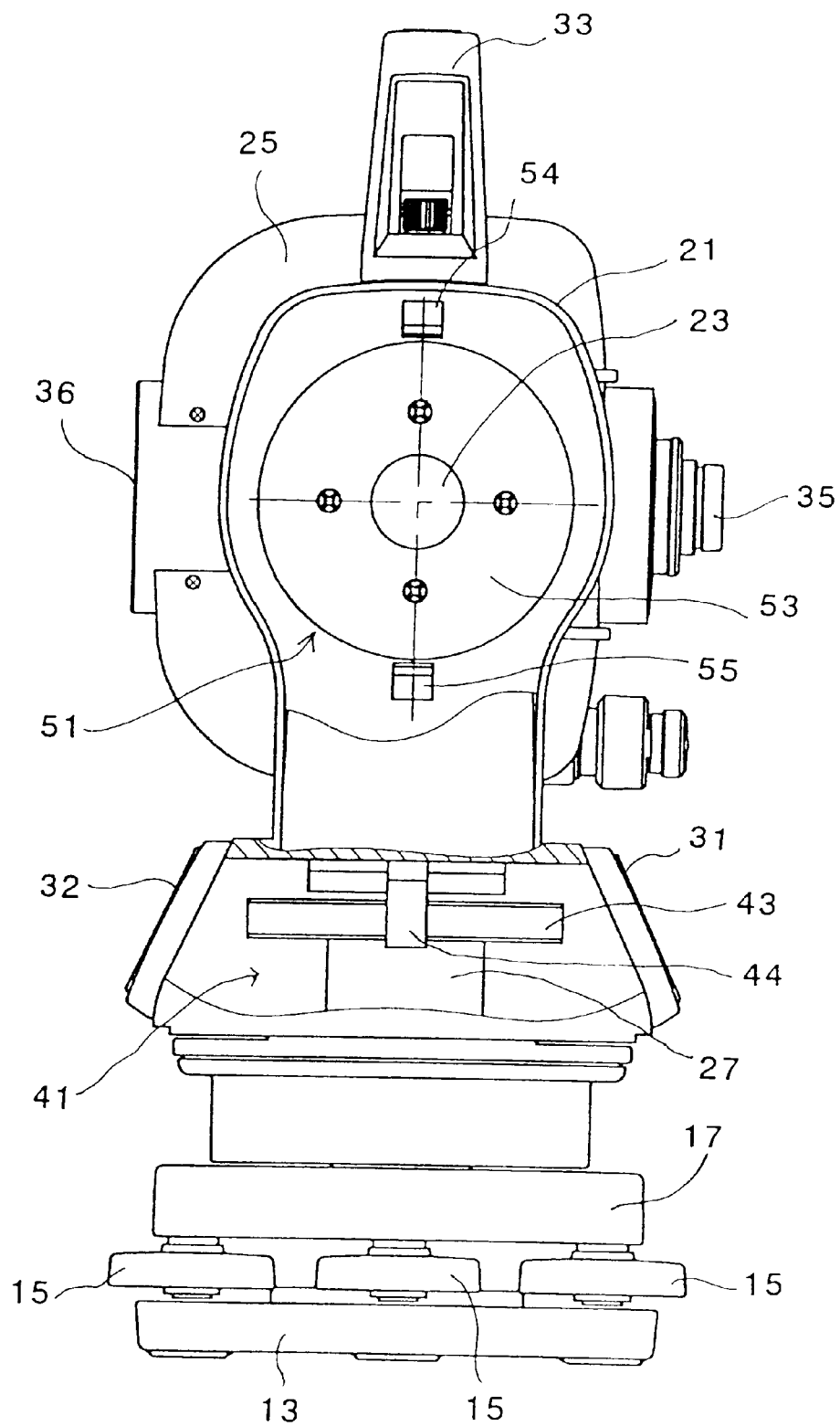
FIG. 2 is a side elevational view of the total station shown in FIG. 1, showing fundamental elements of each magnetic incremental rotary encoder in cross section.

FIGS. 1 and 2 show an embodiment of a total station (including an optical instrument) which incorporates two magnetic incremental rotary encoders.

The total station 11 is provided with a base plate 13, a leveling board 17, a pedestal (stationary portion) 21 and a collimating telescope 25. The base plate 13 is connected to a tripod (not shown) when the total station 11 is mounted thereon. The base plate 13 is provided thereon with three leveling screws 15 on which the leveling board 17 is mounted. The pedestal 21 is mounted on the leveling board 17 via a vertical shaft 19 to be rotatable about the vertical shaft 19. The pedestal 21 is formed so as to have a general U-shaped cross section, and has a pair of supports 21*a* positioned on right and left sides as viewed in FIG. 1. The collimating telescope 25 is held by the pair of supports 21*a* therebetween to be rotatable about the axis of a pair of coaxial horizontal shafts 23 which are fixed to the right and left sides of the collimating telescope 25 as viewed in FIG. 1. The pair of coaxial horizontal shafts 23 are respectively supported by the pair of supports 21*a* to be rotatable about the axis thereof. In FIG. 1 only one of the pair of coaxial horizontal shafts 23 (the left shaft 23 as viewed in FIG. 1) is shown (in cross section).

The vertical shaft 19 is rotatably fitted in and supported by a vertical bearing 27 which is fixed to the leveling board 17. The base of the pedestal 21 which connects the pair of supports 21*a* is fixed to the upper end of the vertical shaft 19. Each horizontal shaft 23 is rotatably supported by a corresponding horizontal bearing 29 fixed to the corresponding support 21*a*. The collimating telescope 25 is fixed to each horizontal shaft 23.

The total station 11 is provided on the vertical shaft 19 with a first magnetic incremental rotary encoder (first rotary encoder/horizontal-angle measuring device) 41 adapted for measuring the angle of rotation (horizontal angle) of the vertical shaft 19 (the pedestal 21 and the collimating telescope 25) with respect to the leveling board 17. The total station 11 is further provided on the horizontal shaft 23 with a second magnetic incremental rotary encoder (second rotary encoder/vertical-angle measuring device) 51 adapted for measuring the angle of rotation (vertical angle) of the horizontal shaft 23 (the collimating telescope 25) with respect to the pedestal 21. The first rotary encoder 41 is provided with a magnetic drum 43 fixed to the vertical shaft 19. The magnetic drum 43 is provided on the outer peripheral surface thereof with a multi-pole magnetized layer (not shown). The first rotary encoder 41 is further provided with two magnetic sensors 44 and 45 which are positioned to face the multi-pole magnetized layer with a slight gap between each magnetic sensor and the multi-pole magnetized layer on the opposite sides of the magnetic drum 43 (the right and left sides of the magnetic drum 43 as viewed in FIG. 1) with respect to the vertical shaft 19. The two magnetic sensors 44 and 45 are offset from each other by approximately 180 degrees about the vertical shaft 19. Likewise, the second rotary encoder 51 is provided with a magnetic drum (graduator disc) 53 fixed to the horizontal shaft 23. The magnetic drum 53 is provided on the outer peripheral surface thereof with a multi-pole magnetized layer 53*a* (see FIG. 3) which is identical to the multi-pole magnetized layer of the magnetic drum 43. The second rotary encoder 51 is further provided with two magnetic sensors 54 and 55 which are positioned to face the multi-pole magnetized layer 53*a* with a slight gap between each magnetic sensor and the multi-pole magnetized layer 53*a* on the opposite sides of the magnetic drum 53 (the upper and lower sides of the magnetic drum 53 as viewed in FIG. 1) with respect to the horizontal shaft 23. The two magnetic sensors 54 and 55 are offset from each other by approximately 180 degrees about the horizontal shaft 23.

Although the details are not shown in the drawings, the total station 11 is provided in the base of the pedestal 21 with an electronic circuit (see FIG. 7) which includes an operational system for determining the angle of rotation of each of the first and second rotary encoders 41 and 51 (i.e., horizontal and vertical angles) by detecting the output voltage of each of the magnetic sensors 44, 45, 54 and 55. The total station 11 is provided on the front and rear faces of the pedestal 21 with operational panels 31 and 32, respectively (see FIG. 2). Each of the operational panels 31 and 32 is provided thereon with a keyboard which is manually operated by an operator to operate and control the total station 11, and a display (e.g., an LCD panel) for indicating the data input by the keyboard, the measured angles, etc.

As shown in FIGS. 1 and 2, the total station 11 is further provided with a grip 33 which is gripped when the total station 11 is carried, and a protection cover 34 which covers the pedestal 21 to protect the first rotary encoder 41 and battery (not shown) from dust. The collimating telescope 25 is provided with an objective lens 36 (see FIG. 2) and an eyepiece 35 (see FIG. 1).

Figure 3:
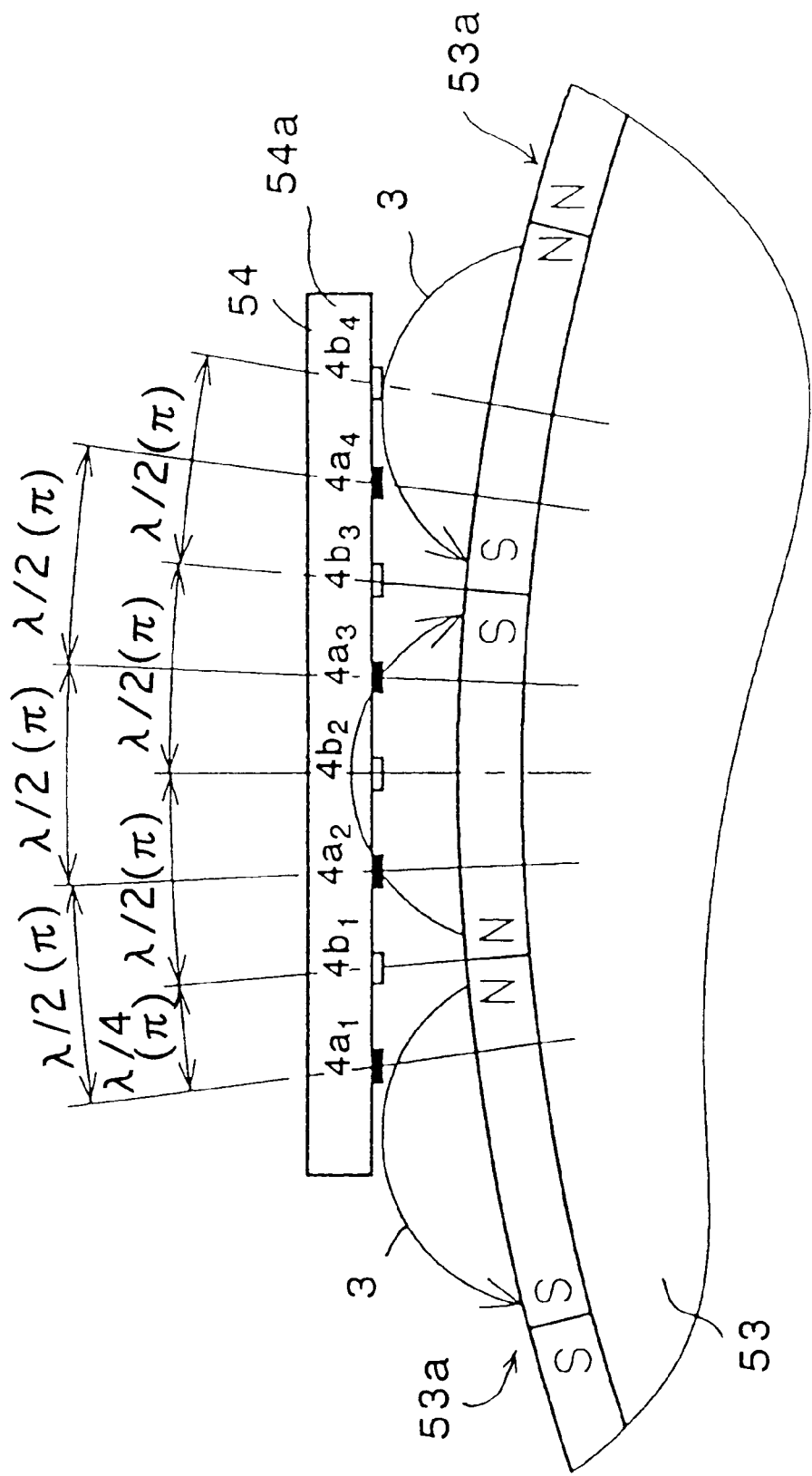
FIG. 3 is an explanatory view of fundamental portion of one of the magnetic incremental rotary encoders shown in FIGS. 1 and 2, showing a relation between a magnetic sensor and the multi-pole magnetized layer of a magnetic drum.

The structure of each of the first and second rotary encoders 41 and 51 will be hereinafter discussed in detail with reference to FIGS. 3 and 4. The fundamental structure of the first rotary encoder 41 is identical to that of the second rotary encoder 51, so that only the structure of the second rotary encoder 51 will be hereinafter discussed in detail. FIG. 3 is an explanatory view of the magnetic sensor 54 and part of the magnetic drum 53, showing a relation between the multi-pole magnetized layer 53*a* of the magnetic drum 53 and the magnetic sensor 54.

The second rotary encoder 51 is provided, on an outer peripheral surface of the magnetic drum 53 thereof, with the multi-pole magnetized layer 53*a* having a plurality of magnetized divisions equally divided by the number of divisions N ("N" being a positive integer). The pitch of the magnetized divisions (i.e., the pitch of two adjacent borders of the magnetic poles) of the multi-pole magnetized layer 53*a* is herein assumed to be "$\lambda$". The first magnetic sensor 54 is positioned to face the multi-pole magnetized layer 53*a* with a slight gap between the first magnetic sensor 54 and the multi-pole magnetized layer 53*a*. The first magnetic sensor 54 is provided with a plane board 54*a* and eight magnetoresistor elements $4a_1$, $4a_2$, $4a_3$, $4a_4$, $4b_1$, $4b_2$, $4b_3$ and $4b_4$. These eight magnetoresistor elements are located at $\lambda/4$ intervals on that surface of the plane board 54*a* which faces the multi-pole magnetized layer 53*a* so that the straight line which substantially perpendicularly penetrates through the center of each magnetoresistor element passes through the rotational axis of the magnetic drum 53.

If the magnetic drum 53 rotates, the second rotary encoder 51 detects the variation of the resistance values of the eight magnetoresistor elements $4a_1$, $4a_2$, $4a_3$, $4a_4$, $4b_1$, $4b_2$, $4b_3$ and $4b_4$, which vary in accordance with the variation of the magnetic field 3 generated by the multi-pole magnetized layer 53*a,* to thereby determine the rotational angle of the magnetic drum 53 at $\lambda/4$ pitch. An angle smaller than the pitch ($\lambda/4$) is determined according to an interpolative calculation. Throughout the specification, "pitch $\lambda$" refers to the pitch angle.

The eight magnetoresistor elements $4a_1$, $4a_2$, $4a_3$, $4a_4$, $4b_1$, $4b_2$, $4b_3$ and $4b_4$ can be divided into two groups, i.e., an A-phase and a B-phase which have a phase difference of $\lambda/4$ or $\lambda(3/4)$ therebetween. The four magnetoresistor elements $4a_1$, $4a_2$, $4a_3$ and $4a_4$ of the A-phase and the four magnetoresistor elements $4b_1$, $4b_2$, $4b_3$ and $4b_4$ of the B-phase are alternately arranged. The four magnetoresistor elements $4a_1$, $4a_2$, $4a_3$ and $4a_4$ of the A-phase are arranged at $\lambda/2$ intervals and the four magnetoresistor elements $4b_1$, $4b_2$, $4b_3$ and $4b_4$ of the B-phase are also arranged at $\lambda/2$ intervals.

As shown in FIG. 4, the four magnetoresistor elements $4a_1$, $4a_2$, $4a_3$ and $4a_4$ of the A-phase are connected in the form of a bridge circuit while the four magnetoresistor elements $4b_1$, $4b_2$, $4b_3$ and $4b_4$ of the B-phase are also connected in the form of a bridge circuit. An electronic circuit (shown in FIG. 7) applies a constant voltages (+v and −V) between the terminals of each of the two bridge circuits. The electronic circuit detects a variation of the magnetic field, i.e., a variation of the angle of rotation of the magnetic drum 53 in accordance with the voltage across terminals $e_0$ and $e_1$ of the A-phase and the voltage across terminals $e_0'$ and $e_1'$ of the B-phase.

According to this illustrated embodiment, the respective resistance values $a_1$, $a_2$, $a_3$ and $a_4$ of the four magnetoresistor elements $4a_1$, $4a_2$, $4a_3$ and $4a_4$ of the A-phase vary in dependence on the variation of the magnetic field 3 generated by the rotation of the magnetic drum 53, in accordance with the following equations:

$$a_1 = R_0 + R\sin(N\omega)$$

$$a_2 = R_0 + R\sin(N\omega + \pi) = R_0 - R\sin(n\omega)$$

$$a_3 = R_0 + R\sin(N\omega + 2\pi) = R_0 + R\sin(N\omega)$$

$$a_4 = R_0 + R\sin(N\omega + 3\pi) = R_0 - R\sin(N\omega)$$

wherein "ω" represents the angle of rotation of the magnetic drum 53, "$R_0$" represents the resistance value in the case of no magnetic field, "R" represents the resistance ratio (coefficient), and "N" represents the number of magnetized divisions of the multi-pole magnetized layer 53a.

The terminals $e_0$ and $e_1$ of the A-phase respectively output two sine wave signals (a SIN wave and a $\overline{\text{SIN}}$ wave) which have a phase difference of 180 degrees therebetween. The difference between these two sine wave signals is amplified to obtain a sine wave signal (i.e., "SIN signal").

The magnetoresistor elements $4b_1$, $4b_2$, $4b_3$ and $4b_4$ of the B-phase are respectively offset from the magnetoresistor elements $4a_1$, $4a_2$, $4a_3$ and $4a_4$ of the A-phase by π/2, so that the terminals $e_0'$ and $e_1'$ of the B-phase respectively output two sine wave signals (a COS wave and a $\overline{\text{COS}}$ wave) which have a phase difference of 180 degrees. The difference between these two sine wave signals is amplified to obtain a sine wave signal (i.e., "COS signal") which has a phase difference of 90 degrees with respect to the aforementioned "SIN signal".

The angle of rotation of the magnetic drum 53 can be determined at a pitch of N/4 by detecting the zero crossing points of the outputs of the A-phase and the B-phase. Accordingly, the detection pitch is four times smaller than (i.e., a quarter of) the number of divisions N to realize a high resolution. In surveying instruments, a detection pitch which is smaller than a quarter of the number of divisions N is generally required, so that the number of magnetized divisions of the multi-pole magnetized layer 53a need to be greater than the number of divisions N. To this end, in the illustrated embodiment, the detected pitch is increased by performing an interpolative calculation such as the following:

$$\tan^{-1}(y/x)$$

wherein

"x" represents the voltage of the A-phase, and

"y" represents the voltage of the B-phase.

The structure of the second magnetic sensor 55 is identical to the structure of the first magnetic sensor 54.

The above discussed are the outlines of the total station 11 and the second rotary encoder 51 incorporated therein. The characteristics of the second rotary encoder 51, which is incorporated in the total station 11 shown in FIGS. 1 and 2, will be further discussed with reference to FIGS. 5 through 9.

Figure 5:
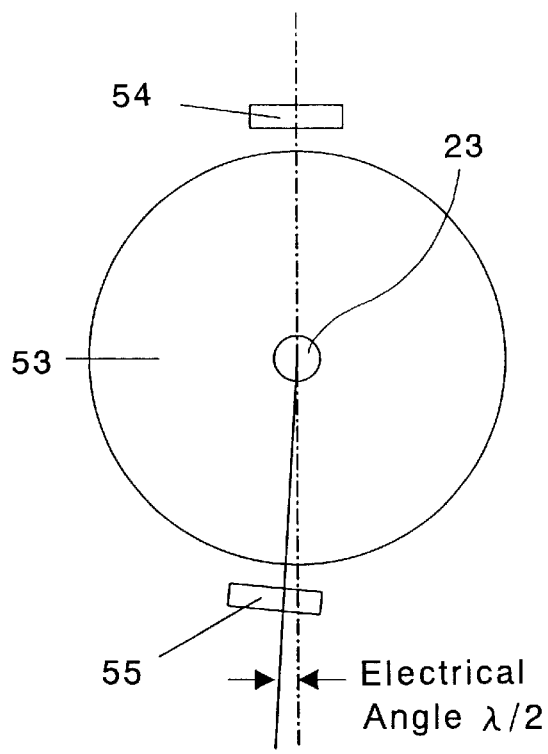
FIG. 5 is a schematic front elevational view of one of the magnetic incremental rotary encoders shown in FIGS. 1 and 2, showing the positional relationship among the magnetic drum and the two magnetic sensors.
Figure 6:
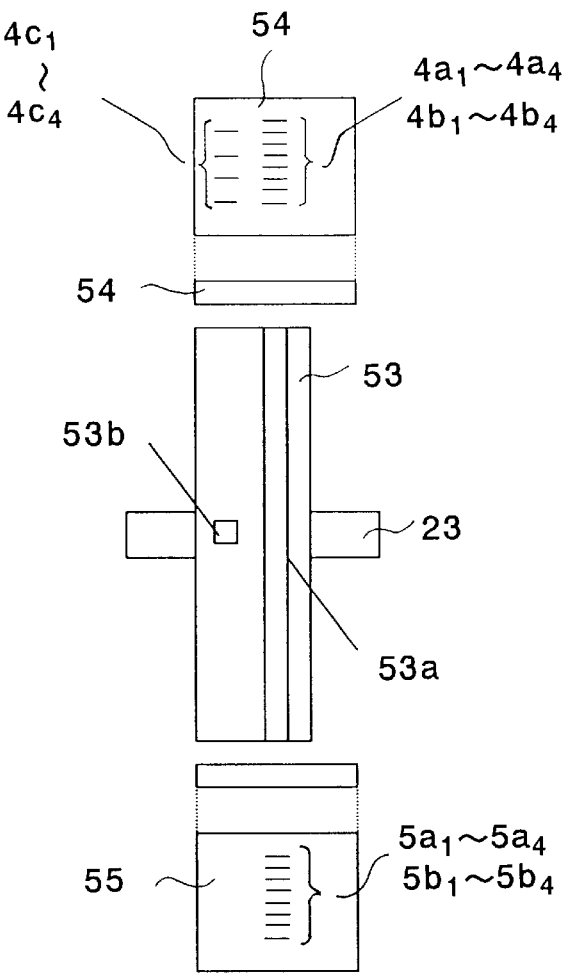
FIG. 6 is a schematic side view, partly shown as plan view, of the magnetic incremental rotary encoder shown in FIG. 5 for explaining about an absolute-zero-index detecting device thereof.

FIG. 5 is a schematic front elevational view of the second rotary encoder 51. FIG. 6 is a schematic side view of the second rotary encoder 51, wherein a plan view of each of the two magnetic sensors 54 and 55 is also shown.

The magnetic sensors 54 and 55 are positioned so as to be offset from each other by approximately 180 degrees about the axis of the horizontal shaft 23 so that the phase of output voltage of the second sensor advances or delays with respect to the phase of output voltage of the first sensor by an electrical angle of λ/2.

The magnetic drum 53 is provided, on an outer peripheral surface thereof at a position separate from the multi-pole magnetized layer 53a in the direction of the axis of the horizontal shaft 23 by a predetermined distance, with an zero index magnetized portion 53b which defines an absolute zero index of the second rotary encoder 51.

In addition to the magnetoresistor elements $4a_1$, $4a_2$, $4a_3$, $4a_4$, $4b_1$, $4b_2$, $4b_3$ and $4b_4$, the first magnetic sensor 54 is further provided with four magnetoresistor elements $4c_1$, $4c_2$, $4c_3$, $4c_4$ adapted for detecting the zero index magnetized portion 53b. The four magnetoresistor elements $4c_1$, $4c_2$, $4c_3$, $4c_4$ are aligned on the first magnetic sensor 54 on a line which is separate, in the direction of the axis of the horizontal shaft 23, from a line on which the magnetoresistor elements $4a_1$, $4a_2$, $4a_3$, $4a_4$, $4b_1$, $4b_2$, $4b_3$ and $4b_4$ are aligned. The magnetoresistor elements $4c_1$, $4c_2$, $4c_3$, $4c_4$ are located at λ/2 intervals. The second magnetic sensor 55 is provided with eight magnetoresistor elements $5a_1$, $5a_2$, $5a_3$, $5a_4$, $5b_1$, $5b_2$, $5b_3$ and $5b_4$ which are identical to the magnetoresistor elements $4a_1$, $4a_2$, $4a_3$, $4a_4$, $4b_1$, $4b_2$, $4b_3$ and $4b_4$ of the first magnetic sensor 54, but is not provided with any magnetoresistor elements for detecting the zero index magnetized portion 53b.

The four magnetoresistor elements $4c_1$, $4c_2$, $4c_3$, $4c_4$ are also connected in the form of a bridge circuit. These four magnetoresistor elements output two sine wave signals (an abs wave and an $\overline{\text{abs}}$ wave) which have a phase difference of 180 degrees therebetween each time the zero index magnetized portion 53b passes by. The difference between these two sine wave signals is amplified through a differential amplifier 73 (see FIG. 7) to output a sine wave signal from the amplifier 73, i.e., a zero index signal "ABS" shown in FIG. 8.

Figure 7:
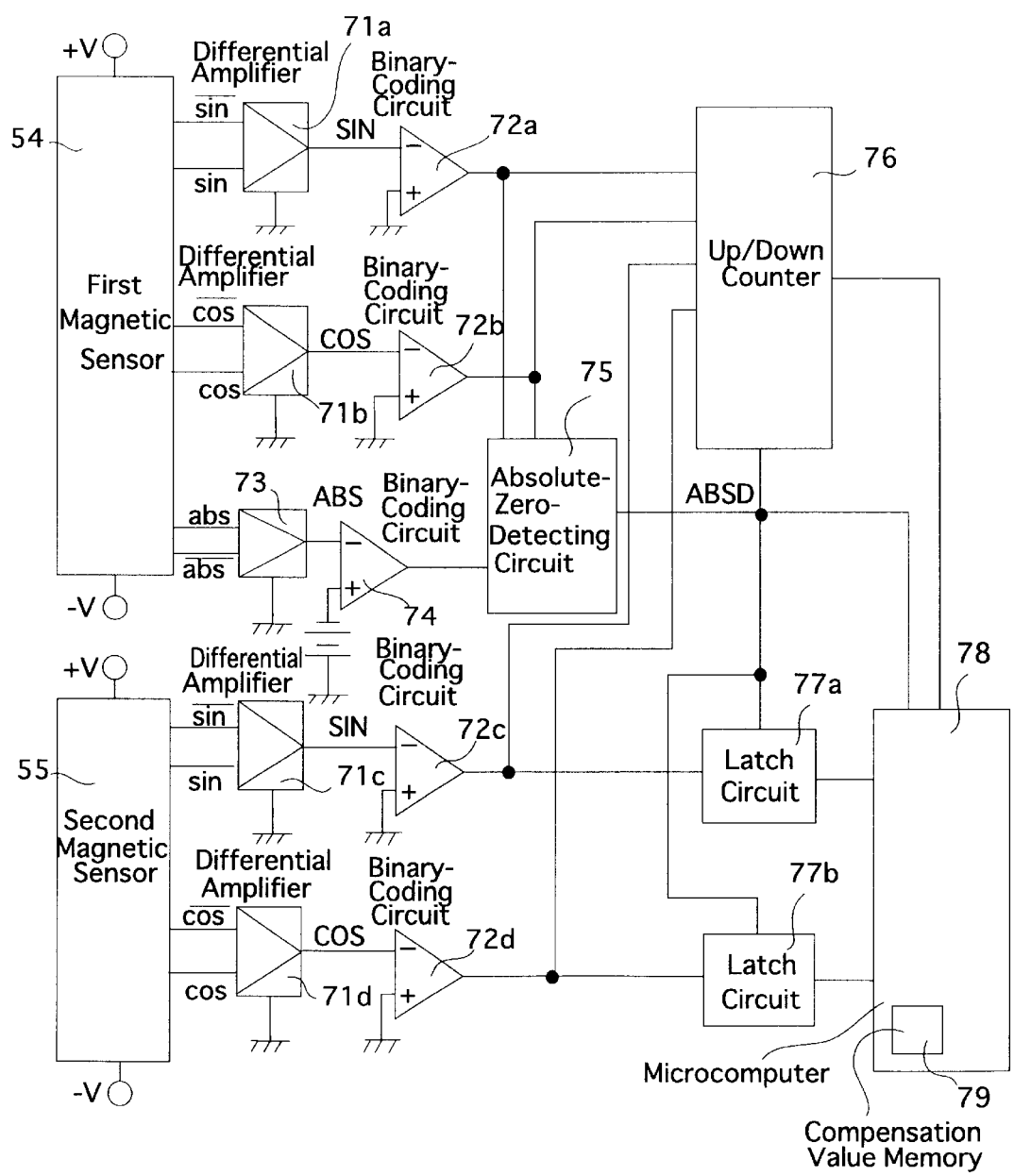
FIG. 7 is a block diagram of fundamental elements of an embodiment of an electronic circuit of the magnetic incremental rotary encoder shown in FIGS. 5 and 6.

The electronic circuit shown in FIG. 7 is provided, on the first magnetic sensor 54 side, with the first magnetic sensor 54, three differential amplifiers 71a, 71b and 73, three binary-coding circuits 72a, 72b and 74, and an absolute-zero-index detecting circuit 75. The absolute-zero-index detecting circuit 75 is a fundamental element of the absolute-zero-index detecting device which outputs an absolute-zero-index detection pulse "ABSD". The electronic circuit shown in FIG. 7 is further provided, on the second magnetic sensor 55 side, with the second magnetic sensor 55, two differential amplifiers 71c and 71d, and two binary-coding circuits 72c and 72d. The electronic circuit shown in FIG. 7 is further provided with an up/down counter 76, two latch circuits (holding devices) 77a and 77b, and a microcomputer (controller) 78.

Figure 8:
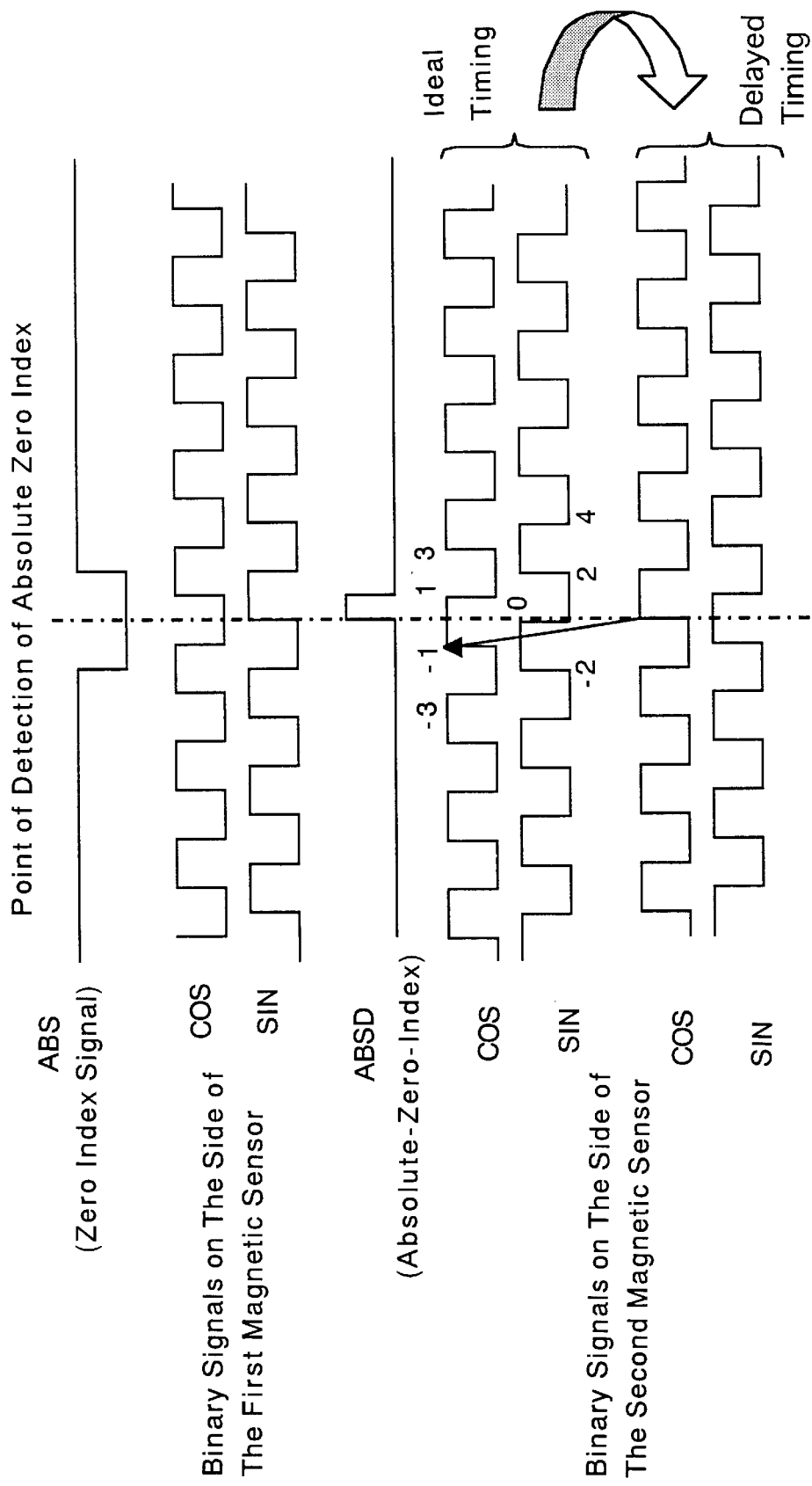
FIG. 8 is a time chart of a zero index signal, binary-coded COS and SIN signals output from one of the two magnetic sensors, and binary-coded COS and SIN signals output from the other magnetic sensor of the magnetic incremental rotary encoder shown in FIGS. 5 and 6 when an absolute zero signal is detected.

The operation of measuring the vertical angle of the horizontal shaft 23 with the second rotary encoder 51 will be hereinafter discussed in detail with reference to the block diagram shown in FIG. 7 and the timing chart shown in FIG. 8.

The electronic circuit applies a constant voltage (+V and −V) between the terminals of the A-phase bridge circuit. If the magnetic drum 53 rotates, two sine wave signals (a SIN wave and a $\overline{\text{SIN}}$ wave) which have a phase difference of 180 degrees therebetween and oscillate with approximately zero volts as the center of the oscillation are output from the terminals $e_0$ and $e_1$ of the A-phase, respectively. The difference between these two sine wave signals is amplified through the differential amplifier 71a to thereby obtain a sine wave signal whose median voltage is approximately zero. This SIN signal is compared with 0 V (zero volts) through the binary-coding circuit 72a to be coded into a binary signal (high/low level signal).

Likewise, the electronic circuit also applies a constant voltage (+V and −V) between the terminals of the B-phase bridge circuit, so that if the magnetic drum 53 rotates, two sine wave signals (a COS wave and a $\overline{\text{COS}}$ wave) which have a phase difference of 90 degrees with respect to the aforementioned two sine wave signals (the SIN wave and the $\overline{\text{SIN}}$ wave) are output from the terminals $e_0'$ and $e_1'$ of the A-phase, respectively. The difference between these two sine wave signals is amplified through the differential amplifier 71b to thereby obtain a sine wave signal (COS signal) whose median voltage is approximately zero. This COS signal is compared with 0 V (zero volts) through the binary-coding circuit 72b to be coded into a binary signal (high/low level signal).

Accordingly, the difference between the SIN wave signal and the $\overline{\text{SIN}}$ wave signal and the difference between the COS wave signal and the $\overline{\text{COS}}$ wave signal which are output from the first magnetic sensor 54 are amplified through the differential amplifiers 71a and 71b, respectively, to thereby obtain the sine wave signal "COS signal" and the sine wave signal "SIN signal" which have a phase difference of 90 degrees with respect to each other. The COS signal is compared with 0 V (zero volts) through the binary-coding circuit 72b to be coded into a binary signal (high/low level signal), the duty cycle being fifty percent. Likewise, the SIN signal is compared with 0 V (zero volts) through the binary-coding circuit 72a to be coded into a binary signal (high/low level signal), the duty cycle also being fifty percent.

Likewise, the difference between the SIN wave signal and the $\overline{\text{SIN}}$ wave signal and the difference between the COS wave signal and the $\overline{\text{COS}}$ wave signal, which are output from the second magnetic sensor 55, are amplified through the differential amplifiers 71c and 71d, respectively, to thereby obtain the sine wave signal "COS signal" and the sine wave signal "SIN signal" which have a phase difference of 90 degrees with respect to each other. The COS signal is compared with 0 V (zero volts) through the binary-coding circuit 72d to be coded into a binary signal (high/low level signal), the duty cycle being fifty percent. Likewise, the SIN signal is compared with 0 V (zero volts) through the binary-coding circuit 72c to be coded into a binary signal (high/low level signal), the duty cycle also being fifty percent.

In the electronic circuit on the first magnetic sensor 54 side having a function to detect the zero index magnetized portion 53b, the difference between the two sine wave signals (the abs wave and the $\overline{\text{abs}}$ wave), which are output from the first magnetic sensor 54, is amplified through the differential amplifier 73 to thereby obtain the zero index signal ABS shown in FIG. 7. This signal is coded into a binary signal (high/low level signal) through the binary-coding circuit 74. Subsequently, this binary zero index signal ABS is combined with the SIN signal and the COS signal respectively output from the binary-coding circuit 72a and the binary-coding circuit 72b to thereby generate the absolute-zero-index detection pulse ABSD (see FIG. 8) through the absolute-zero-index detecting circuit 75. In the present embodiment, the absolute-zero-index detection pulse ABSD is generated to rise from zero to one at the moment the binary SIN signal rises from zero to one on condition that the zero index signal ABS is zero and that the binary COS signal is zero.

The level data (1 or 0) of the binary SIN signal and the level data (1 or 0) of the binary COS signal on the second magnetic sensor 55 are latched into the latch circuits 77a and 77b, respectively, to be input into the microcomputer 78 in response to the rise of the absolute-zero-index detection pulse ABSD.

After the microcomputer 78 detects the absolute-zero-index detection pulse ABSD, the up/down counter 76 increases or decreases the counter value thereof in accordance with the direction of rotation of the magnetic drum 53 each time the microcomputer 78 detects the point of variation of each of the SIN signal and the COS signal which are output from each of the first and second magnetic sensors 54 and 55.

In accordance with the logic of the outputs of the latch circuits 77a and 77b, the microcomputer 78 determines whether the timing of the output of each of the binary SIN and COS signals advances or delays by units of 1/4 pitch relative to an expected timing (an expected value) to determine a compensation value which corresponds to the timing which advances or delays. Subsequently, the microcomputer 78 uses the sum of the compensation value and the counter value of the up/down counter 76 when calculating the vertical angle of the horizontal shaft 23.

An embodiment of the process of determining the compensation value will be hereinafter discussed with reference to the timing chart shown in FIG. 8 and the flow chart shown in FIG. 9.

A point of detection of the absolute zero index (i.e., a point of generation of the absolute-zero-index detection pulse "ABSD") corresponds to the moment the binary SIN signal generated from the first magnetic sensor 54 rises from zero to one on condition that the binary COS signal generated from the first magnetic sensor 54 is zero while the zero index signal ABS is being generated (i.e., while the zero index signal ABS is zero). The level "1" of the COS signal and the level "0" of the SIN signal, which are generated from the second magnetic sensor 55, at this time are the ideal levels (the expected values) thereof when the second rotary encoder 51 is not under the influence of the gap between the horizontal shaft 23 and the horizontal bearing 29.

It is herein assumed that the phase of the COS and SIN signals of the second magnetic sensor 55, wherein an absolute-zero-index detecting device is not provided, delays with respect to the phase of the COS and SIN signals of the first magnetic sensor 54 by 90 degrees due to the influence of the gap between the horizontal shaft 23 and the horizontal bearing 29. In this assumption, the phase of the COS and SIN signals of the second magnetic sensor 55 at the time of detection of the zero index magnetized portion 53b gives minus one (−1) count to the original count (expected count). Thereafter, the up/down counter 76 increases or decreases the counter value thereof with a 90-degree delay point being regarded as the point of commencement of counting (the point of detection of the absolute zero index), so that the aforementioned minus one (−1) count remains as an error (absolute-zero-index detection error) in the counter value in the subsequently counting operation. In order to overcome this problem, according to the present embodiment, such a minus one (−1) count is added, as a compensation value, to the actual counter value which is read out of the up/down counter 76.

Table 1 below shows the relation between the logic of the outputs of the latch circuits 77a and 77b and the compensation value.

TABLE 1

| latch circuit 77b<br>COS Signal | latch circuit 77a<br>SIN Signal | compensation<br>value |
|---|---|---|
| L | L | +1 |
| H | L | ±0 |
| H | H | −1 |
| L | H | −2 | wherein "L" represents the low level (0), and "H" represents the high level (1).

The compensation value is determined by the microcomputer 78, while the counter value of the up/down counter 76 is compensated by the microcomputer 78. The microcomputer 78 is provided therein with a compensation value memory 79 in which the determined compensation value is stored. The process of determining the compensation value and the process of compensating for the counter value of the up/down counter 76 will be hereinafter discussed in detail with reference to the flow chart shown in FIG. 9.

Figure 9:
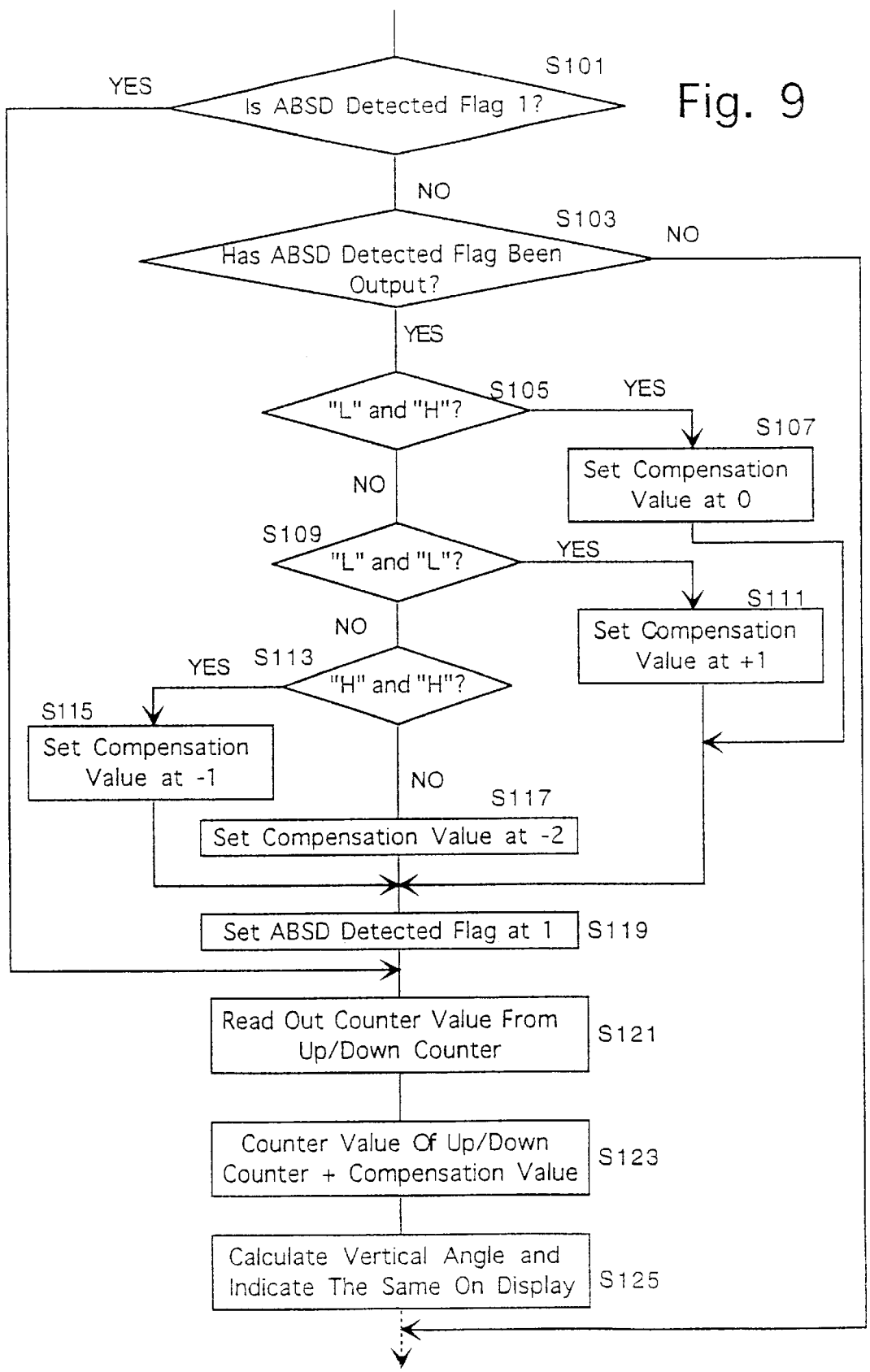
FIG. 9 is a flow chart showing fundamental operations of the magnetic incremental rotary encoder shown in FIGS. 5 and 6 when it detects the absolute zero index.

The flow chart in FIG. 9 includes only fundamental operations for measuring the vertical angle in the process of determining the compensation value and the process of compensating for the counter value of the up/down counter 76. The microcomputer 78 usually performs an interpolative calculation for determining the detected angle which is smaller than the pitch ($\lambda/4$), and also other processes such as a process of initializing the system and a process of measuring the horizontal angle.

The microcomputer 78 continues to perform the process shown in FIG. 9 when the power of the total station 11 is ON. Firstly, it is determined whether an absolute-zero-index-detection-pulse detected flag (hereinafter referred to as the "ABSD detected flag") has been set at one (step S101). If it is determined that the ABSD detected flag has not yet been set at one, control proceeds to step S103 at which it is determined whether the absolute-zero-index detection pulse ABSD has been output. If it is determined that the absolute-zero-index detection pulse ABSD has not yet been output, control exits out of the process shown in FIG. 9.

If it is determined at step S103 that the absolute-zero-index detection pulse ABSD has been output, it is determined if the levels of the outputs of latch circuits 77a and 77b are low (L) and high (H), respectively (step S105). If so (YES), this indicates an error-free state; namely, the phase of output voltage of the second sensor 55 does not advance or delay with respect to the phase of output voltage of the first sensor 54, so that control proceeds to step S107 at which the compensation value is set at zero and stored in the compensation value memory 79. Subsequently control proceeds to step S119.

If it is determined at step S105 that the levels of the outputs of latch circuits 77a and 77b are not low (L) and high (H), respectively, control proceeds to step S109 at which it is determined if the levels of the outputs of latch circuits 77a and 77b are low (L) and low (L), respectively. If so, this indicates that the phase of output voltage of the second sensor 55 advances with respect to the phase of output voltage of the first sensor 54 by 1/4 pitch, so that control proceeds to step S111 at which the compensation value is set at plus one (+1) and stored in the compensation value memory 79. Subsequently control proceeds to step S119.

If it is determined at step S109 that the levels of the outputs of latch circuits 77a and 77b are not low (L) and low (L), respectively, control proceeds to step S113 at which it is determined if the levels of the outputs of latch circuits 77a and 77b are high (H) and high (H), respectively. If so, this indicates that the phase of output voltage of the second sensor 55 delays with respect to the phase of output voltage of the first sensor 54 by 1/4 pitch, so that control proceeds to step S115 at which the compensation value is set at minus one (−1) and stored in the compensation value memory 79. Subsequently control proceeds to step S119.

If it is determined at step S113 that the levels of the outputs of latch circuits 77a and 77b are not high (H) and high (H), respectively; namely, in the case where the levels of the outputs of latch circuits 77a and 77b are high (H) and low (L), this indicates that the phase of output voltage of the second sensor 55 delays with respect to the phase of output voltage of the first sensor 54 by 1/2 pitch, so that control proceeds to step S117 at which the compensation value is set at minus two (−2) and stored in the compensation value memory 79. Subsequently control proceeds to step S119.

After the logic of the outputs of the latch circuits 77a and 77b has been checked in the aforementioned manner, the ABSD detected flag is set at one (step S119). Subsequently, the counter value of the up/down counter 76 is read out therefrom to be input into the microcomputer 78 (step S121). Subsequently, the compensation value is added to the counter value of the up/down counter 76 to compensate for the counter value (step S123). Subsequently, the vertical angle of the collimating telescope 25 is calculated in accordance with the compensated counter value of the up/down counter 76 to be indicated on the display on at least one of the operational panels 31 and 32 (step S125).

Thereafter, when the operation at step S101 is performed, the ABSD detected flag has already been set, so that control proceeds from step S101 to step S121 to skip the operations from step S103 to step S119. Namely, in the case where the ABSD detected flag has already been set, control skips the operations from step S103 to step S119 as long as the power remains ON.

As can be understood from the above discussion, according to the illustrated embodiment, even if the second rotary encoder 51 is designed in a manner such that the two sensors 54 and 55 are positioned so as to be offset from each other by 180 degrees about the magnetic drum 53 and that the absolute-zero-index detecting device is provided for only the first magnetic sensor 54, it is possible to determine whether the phase of output voltage of the second sensor 55 advances or delays by units of 1/4 pitch with respect to the phase of output voltage of the first sensor. Therefore, the accuracy of the encoder for measuring the vertical angle can be improved by determining the compensation value for compensating for the counter value of the up/down counter 76 in accordance with the logic of the outputs of the latch circuits 77a and 77b, and thereafter adding the determined compensation value to the actual counter value of the up/down counter 76.

According to the illustrated embodiment, the influence of the gap between the horizontal shaft 23 and the horizontal bearing 29 can be eliminated. Moreover, an incremental rotary encoder can be achieved in which the absolute-zero-index detection error does not occur even if only one of the two sensors, which are positioned so as to be offset from each other by 180 degrees about the rotary disc or drum, is provided with the absolute-zero-index detecting device. Furthermore, the absolute-zero-index detection error of 1/4 pitch when the absolute zero index is detected can be prevented from occurring.

The illustrated embodiment of the incremental rotary encoder is valid only in the case where the phase of output voltage of one of the two magnetic sensors having no absolute-zero-index detecting device advances or delays with respect to the phase of output voltage of the other magnetic sensor having the absolute-zero-index detecting device by within one pitch. Therefore, the present invention is effectively applied to an incremental rotary encoders which output less pulses than a photoelectric incremental rotary encoders per revolution (about a few thousand pulses per revolution) such as a magnetic incremental rotary encoder.

The first rotary encoder 41 can be designed identical to the second rotary encoder 51.

As can be understood from the foregoing, according to the present invention, since the latch circuits 77a and 77b hold the level data of the binary signal of each sine wave signal output from the second sensor at the moment the absolute-zero-index detecting device outputs the zero index signal, and since the microcomputer 78 determines whether the phase of the two sine wave signals output from said second sensor advances or delays with respect to the phase of said two sine wave signals output from said first sensor, the point of detection of the absolute zero index by the second sensor can be compensated for by providing the absolute-zero-index detecting device for only the first sensor.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. An incremental rotary encoder having a first sensor and a second sensor, each of said first and second sensors outputting two sine wave signals having a phase difference of 90 degrees while a rotary member of said incremental rotary encoder rotates, said first and second sensors being positioned so as to be offset from each other by 180 degrees about said rotary member, said incremental rotary encoder comprising:

an absolute-zero-index detecting device, provided for said first sensor, which outputs a zero index signal each time said first sensor detects an absolute zero index formed on said rotary member;

at least one binary coding circuit which codes each of said two sine wave signals and said zero index signal into a corresponding binary signal;

a holding device for holding the level data of said binary signal of each of said two sine wave signals output from said second sensor, at the moment said absolute-zero-index detecting device outputs said zero index signal; and a controller for determining whether the phase of said two sine wave signals output from said second sensor advances or delays with respect to the phase of said two sine wave signals output from said first sensor.

2. The incremental rotary encoder according to claim 1, further comprising:

a counter which increases or decreases a counter value thereof each time a point of variation occurs in each of said two sine wave signals output from each of said first and second sensors; wherein said controller calculates an angle of rotation of said rotary member in accordance with said counter value of said counter which starts counting from a point of detection of said absolute zero index by said absolute-zero-index detecting device; and wherein said controller compensates for said counter value generated from said second sensor in accordance with a determination of advancing or delaying by said controller to determine said angle of rotation.

3. The incremental rotary encoder according to claim 1, wherein said controller device determines whether said phase of said two sine wave signals output from said second sensor advances or delays with respect to said phase of said two sine wave signals output from said first sensor at 1/4 pitch.

4. The incremental rotary encoder according to claim 1, wherein said rotary member comprises a magnetic drum which is provided on an outer peripheral surface thereof with a multi-pole magnetized layer having a plurality of magnetized divisions equally divided, a pitch $\lambda$ of said plurality of magnetized divisions being predetermined, said magnetic drum being rotatably supported by a stationary portion;

wherein each of said first sensor and said second sensor comprises a magnetic sensor fixed relative to said stationary member to face said multi-pole magnetized layer;

wherein each of said first sensor and said second sensor comprises a plurality of magnetoresistor elements which are located at $\lambda/4$ intervals; and wherein said plurality of magnetoresistor elements are divided into two groups, magnetoresistor elements of each group of said two groups of magnetoresistor elements being arranged at $\lambda/2$ intervals.

5. The incremental rotary encoder according to claim 4, further comprising at least one differential amplifier which amplifies the difference between outputs of each said two groups of magnetoresistor elements to output a sine wave signal.

6. The incremental rotary encoder according to claim 5, wherein said magnetic drum comprises a magnetized portion which defines said absolute zero index, said magnetized portion being positioned on an outer peripheral surface of said magnetic drum at a position separate from said multi-pole magnetized layer in a direction of a rotational axis of said magnetic drum; and wherein said magnetic sensor of said first sensor comprises at least one magnetoresistor element which is positioned so as to be able to face said magnetized portion to output said zero index signal each time said magnetized portion passes by said at least one magnetoresistor element.

7. The incremental rotary encoder according to claim 6, wherein said absolute-zero-index detecting device comprises an absolute-zero-index detecting circuit which outputs an absolute-zero-index detection pulse at the moment the level of one of said two sine wave signals output from said first sensor varies while said zero index signal is being generated; and wherein two binary signals of two level data are output from said second sensor while said absolute-zero-index detection pulse is output.

8. The incremental rotary encoder according to claim 7, further comprising a memory in which a compensation value, which corresponds with a determination of advancing or delaying by said controller, is stored;

wherein said controller detects a combination of said two level data of said two binary signals at the moment said absolute-zero-index detecting circuit outputs said absolute-zero-index detection pulse, subsequently determines whether said phase of said two sine wave signals output from said second sensor advances or delays with respect to said phase of said two sine wave signals output from said first sensor at 1/4 pitch, and thereafter stores a compensation value on advancing or delaying determined by said controller in said memory, and wherein said compensation value, which is stored in said memory, is added to said counter value to compensate for said counter value.

9. The incremental rotary encoder according to claim 5, wherein the median voltage of said sine wave signal is approximately zero.

10. The incremental rotary encoder according to claim 1, wherein said incremental rotary encoder is a magnetic incremental rotary encoder.

11. A surveying instrument comprising:

a leveling board;

a pedestal coupled to said leveling board to be rotatable about a vertical axis relative to said leveling board;

a collimating telescope coupled to said pedestal to be rotatable about a horizontal axis relative to said pedestal;

a horizontal-angle measuring device for measuring an angle of rotation of said pedestal relative to said leveling board; and a vertical-angle measuring device for measuring an angle of rotation of said collimating telescope relative to said pedestal;

wherein at least one of said horizontal-angle measuring device and said vertical-angle measuring device comprises an incremental rotary encoder having a first sensor and a second sensor, each of said first and second sensors outputting two sine wave signals having a phase difference of 90 degrees while a rotary member of said incremental rotary encoder rotates, said first and second sensors being positioned so as to be offset from each other by 180 degrees about said rotary member, said incremental rotary encoder comprising:

an absolute-zero-index detecting device, provided for said first sensor, which outputs a zero index signal each time said first sensor detects an absolute zero index formed on said rotary member;

at least one binary coding circuit which codes each of said two sine wave signals and said zero index signal into a corresponding binary signal;

a holding device for holding the level data of said binary signal of each of said two sine wave signals output from said second sensor, at the moment said absolute-zero-index detecting device outputs said zero index signal; and a controller for determining whether the phase of said two sine wave signals output from said second sensor advances or delays with respect to the phase of said two sine wave signals output from said first sensor.

12. The incremental rotary encoder according to claim 11, further comprising:

a counter which increases or decreases a counter value thereof each time a point of variation occurs in each of said two sine wave signals output from each of said first and second sensors; wherein said controller calculates an angle of rotation of said rotary member in accordance with said counter value of said counter which starts counting from a point of detection of said absolute zero index by said absolute-zero-index detecting device; and wherein said controller compensates for said counter value generated from said second sensor in accordance with a determination of advancing or delaying by said controller to determine said angle of rotation.

13. The incremental rotary encoder according to claim 11, wherein said controller device determines whether said phase of said two sine wave signals output from said second sensor advances or delays with respect to said phase of said two sine wave signals output from said first sensor at 1/4 pitch.

14. The incremental rotary encoder according to claim 11, wherein said rotary member comprises a magnetic drum which is provided on an outer peripheral surface thereof with a multi-pole magnetized layer having a plurality of magnetized divisions equally divided, a pitch $\lambda$ of said plurality of magnetized divisions being predetermined, said magnetic drum being rotatably supported by a stationary portion;

wherein each of said first sensor and said second sensor comprises a magnetic sensor fixed relative to said stationary member to face said multi-pole magnetized layer;

wherein each of said first sensor and said second sensor comprises a plurality of magnetoresistor elements which are located at $\lambda/4$ intervals; and wherein said plurality of magnetoresistor elements are divided into two groups, magnetoresistor elements of each group of said two groups of magnetoresistor elements being arranged at $\lambda/2$ intervals.

15. The incremental rotary encoder according to claim 14, further comprising at least one differential amplifier which amplifies the difference between outputs of each said two groups of magnetoresistor elements to output a sine wave signal.

16. The incremental rotary encoder according to claim 15, wherein said magnetic drum comprises a magnetized portion which defines said absolute zero index, said magnetized portion being positioned on an outer peripheral surface of said magnetic drum at a position separate from said multi-pole magnetized layer in a direction of a rotational axis of said magnetic drum; and wherein said magnetic sensor of said first sensor comprises at least one magnetoresistor element which is positioned so as to be able to face said magnetized portion to output said zero index signal each time said magnetized portion passes by said at least one magnetoresistor element.

17. The incremental rotary encoder according to claim 16, wherein said absolute-zero-index detecting device comprises an absolute-zero-index detecting circuit which outputs an absolute-zero-index detection pulse at the moment the level of one of said two sine wave signals output from said first sensor varies while said zero index signal is being generated; and wherein two binary signals of two level data are output from said second sensor while said absolute-zero-index detection pulse is output.

18. The incremental rotary encoder according to claim 17, further comprising a memory in which a compensation value, which corresponds with a determination of advancing or delaying by said controller, is stored;

wherein said controller detects a combination of said two level data of said two binary signals at the moment said absolute-zero-index detecting circuit outputs said absolute-zero-index detection pulse, subsequently determines whether said phase of said two sine wave signals output from said second sensor advances or delays with respect to said phase of said two sine wave signals output from said first sensor at 1/4 pitch, and thereafter stores a value on advancing or delaying determined by said controller in said memory, and wherein said compensation value, which is stored in said memory, is added to said counter value to compensate for said counter value.

19. The incremental rotary encoder according to claim 15, wherein the median voltage of said sine wave signal is approximately zero.

20. The incremental rotary encoder according to claim 11, wherein said incremental rotary encoder is a magnetic incremental rotary encoder.

* * * * *